(12) United States Patent
Yudovsky et al.

(10) Patent No.: US 10,658,223 B2
(45) Date of Patent: May 19, 2020

(54) APPARATUS FOR PREVENTION OF BACKSIDE DEPOSITION IN A SPATIAL ALD PROCESS CHAMBER

(71) Applicant: Applied Materials, Inc., Santa Clara, CA (US)

(72) Inventors: Joseph Yudovsky, Campbell, CA (US); Alexander S. Polyak, Palm Coast, FL (US)

(73) Assignee: Applied Materials, Inc., Santa Clara, CA (US)

( * ) Notice: Subject to any disclaimer, the term of this patent is extended or adjusted under 35 U.S.C. 154(b) by 210 days.

(21) Appl. No.: 15/494,840

(22) Filed: Apr. 24, 2017

(65) Prior Publication Data
US 2017/0309512 A1 Oct. 26, 2017

Related U.S. Application Data

(60) Provisional application No. 62/326,816, filed on Apr. 24, 2016.

(51) Int. Cl.
| | | |
|---|---|---|
| *H01L 21/683* | (2006.01) | |
| *C23C 16/458* | (2006.01) | |
| *C23C 16/44* | (2006.01) | |
| *C23C 16/455* | (2006.01) | |
| *H01L 21/687* | (2006.01) | |

(52) U.S. Cl.
CPC .... *H01L 21/68764* (2013.01); *C23C 16/4412* (2013.01); *C23C 16/4584* (2013.01); *C23C 16/45551* (2013.01); *H01L 21/6838* (2013.01); *H01L 21/68735* (2013.01); *H01L 21/68771* (2013.01); *H01L 21/68792* (2013.01)

(58) Field of Classification Search
CPC ... B25B 11/00; B25B 11/005; C23C 16/4584; C23C 16/45551; H01L 21/68764; H01L 21/6838; H01L 21/68771
USPC ........................................................ 269/21, 40
See application file for complete search history.

(56) References Cited

U.S. PATENT DOCUMENTS

| | | |
|---|---|---|
| 5,338,362 A | 8/1994 | Imahashi |
| 5,447,570 A | 9/1995 | Schmitz |

(Continued)

FOREIGN PATENT DOCUMENTS

| | | |
|---|---|---|
| JP | S58181714 A | 10/1983 |
| WO | 2008100846 A2 | 8/2008 |

OTHER PUBLICATIONS

PCT International Search Report and Written Opinion in PCT/US2017/029078 dated Jul. 11, 2017, 12 pages.

(Continued)

*Primary Examiner* — Monica S Carter
*Assistant Examiner* — Abbie E Quann
(74) *Attorney, Agent, or Firm* — Servilla Whitney LLC

(57) ABSTRACT

Susceptor assemblies comprising a susceptor with a support post are described. The susceptor has a body with a top surface and a bottom surface. The top surface has a plurality of recesses therein. The support post is connected to the bottom surface of the susceptor to rotate the susceptor assembly. The support post includes support post vacuum plenum in fluid communication with a susceptor vacuum plenum in the body of the susceptor. The support post also includes a purge gas line extending through the support post to a purge gas plenum in the body of the susceptor.

20 Claims, 7 Drawing Sheets

(56) References Cited

U.S. PATENT DOCUMENTS

| | | |
|---|---|---|
| 5,476,548 A | 12/1995 | Lei et al. |
| 5,516,367 A | 5/1996 | Lei et al. |
| 5,747,113 A | 5/1998 | Tsai |
| 6,576,062 B2 | 6/2003 | Matsuse |
| 8,043,432 B2 | 10/2011 | Dip |
| 2001/0007244 A1 | 7/2001 | Matsuse |
| 2003/0233768 A1* | 12/2003 | Kaeppeler ............ C23C 16/4584 34/560 |
| 2007/0119370 A1* | 5/2007 | Ma ........................ C23C 16/18 118/723 E |
| 2008/0229811 A1* | 9/2008 | Zhao ..................... B25B 11/005 73/104 |
| 2009/0143911 A1 | 6/2009 | Gage et al. |
| 2010/0186669 A1 | 7/2010 | Shin et al. |
| 2011/0159702 A1 | 6/2011 | Ohizumi et al. |
| 2011/0290175 A1 | 12/2011 | Paranjpe et al. |
| 2016/0020132 A1* | 1/2016 | Yudovsky ........... H01L 21/6838 438/800 |
| 2016/0079057 A1 | 3/2016 | Varadarajan et al. |

OTHER PUBLICATIONS

PCT International Preliminary Report on Patentability in PCT/US2017/029078 dated Nov. 8, 2018, 7 pages.

\* cited by examiner

APPARATUS FOR PREVENTION OF BACKSIDE DEPOSITION IN A SPATIAL ALD PROCESS CHAMBER

CROSS-REFERENCE TO RELATED APPLICATIONS

This application claims priority to U.S. Provisional Application No. 62/326,816, filed Apr. 24, 2016, the entire disclosure of which is hereby incorporated by reference herein.

TECHNICAL FIELD

The present disclosure relates generally to apparatus and methods of preventing backside deposition. In particular, the disclosure relates to apparatus and methods for preventing deposition on the backside of substrates in a spatial atomic layer deposition process chamber.

BACKGROUND

During spatial atomic layer deposition (ALD) processes, deposition gases can contact the back of the substrate resulting in backside deposition. Backside deposition can be an issue in batch processing chambers that use a multi-wafer susceptor arrangement. Current batch processing systems have backside deposition of as much as 30 mm margin around the outer edge of the wafer. Therefore, there is a need in the art for apparatus and methods to prevent backside deposition in batch processing chambers.

SUMMARY

One or more embodiments of the disclosure are directed to susceptor assemblies comprising a susceptor with a support post. The susceptor has a body with a top surface and a bottom surface. The top surface has a plurality of recesses therein. The support post is connected to the bottom surface of the susceptor to rotate the susceptor assembly. The support post includes support post vacuum plenum in fluid communication with a susceptor vacuum plenum in the body of the susceptor. The support post also includes a purge gas line extending through the support post to a purge gas plenum in the body of the susceptor.

Additional embodiments of the disclosure are directed to susceptor assemblies comprising a susceptor having a body with a top surface and bottom surface. The top surface has a plurality of recesses therein. Each of the recesses has a purge ring within an outer peripheral region of the recess forming an annular cavity. A support post is connected to the bottom surface of the susceptor to rotate the susceptor assembly. The support post includes: a support post vacuum plenum in fluid communication with a susceptor vacuum plenum in the body of the susceptor; a purge gas line extending through the support post to a purge gas plenum in the body of the susceptor; a plurality of radial purge gas feed channels within the body, wherein two radial purge gas feed channels are in fluid communication with the purge gas plenum and the annular cavity of each of the recesses; and a plurality of radial vacuum feed channels, wherein one radial vacuum feed channel is in fluid communication with the susceptor vacuum plenum and each recess.

Further embodiments of the disclosure are directed to susceptor assemblies comprising a susceptor having a body with a top surface and bottom surface. The top surface has a plurality of recesses therein. Each of the recesses has a purge ring within an outer peripheral region of the recess forming an annular cavity. A support post is connected to the bottom surface of the susceptor to rotate the susceptor assembly. The support post includes: a support post vacuum plenum in a central portion of the a top of the support post, the support post vacuum plenum in fluid communication with a susceptor vacuum plenum in the body of the susceptor; a purge gas line extending through the support post, splitting at a junction below the support post vacuum plenum into two upper purge gas lines, the upper purge gas lines having substantially the same conductance and in fluid communication with a purge gas plenum in the body of the susceptor; a plurality of radial purge gas feed channels within the body, wherein two radial purge gas feed channels are in fluid communication with the purge gas plenum and the annular cavity of each of the recesses, each of the radial purge gas feed channels having two holes of different sizes with substantially the same conductance; a plurality of radial vacuum feed channels, wherein one radial vacuum feed channel is in fluid communication with the susceptor vacuum plenum and each recess, each of the radial vacuum feed channels in fluid communication with a plurality of apertures in the recess; and a purge ring in each recess, the purge ring comprising a first compression gap forming a first ring plenum to increase pressure uniformity in the first ring plenum and a second compression gap forming a second ring plenum to define an annular velocity of gas exiting the second ring plenum.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments.

DETAILED DESCRIPTION

Before describing several exemplary embodiments of the disclosure, it is to be understood that the disclosure is not limited to the details of construction or process steps set forth in the following description. The disclosure is capable of other embodiments and of being practiced or being carried out in various ways.

A "substrate" as used herein, refers to any substrate or material surface formed on a substrate upon which film processing is performed during a fabrication process. For example, a substrate surface on which processing can be performed include materials such as silicon, silicon oxide, strained silicon, silicon on insulator (SOI), carbon doped silicon oxides, amorphous silicon, doped silicon, germanium, gallium arsenide, glass, sapphire, and any other materials such as metals, metal nitrides, metal alloys, and other conductive materials, depending on the application. Substrates include, without limitation, semiconductor wafers. Substrates may be exposed to a pretreatment process to polish, etch, reduce, oxidize, hydroxylate, anneal and/or bake the substrate surface. In addition to film processing directly on the surface of the substrate itself, in the present disclosure, any of the film processing steps disclosed may also be performed on an underlayer formed on the substrate as disclosed in more detail below, and the term "substrate surface" is intended to include such underlayer as the context indicates. Thus for example, where a film/layer or partial film/layer has been deposited onto a substrate surface, the exposed surface of the newly deposited film/layer becomes the substrate surface.

Figure 1:
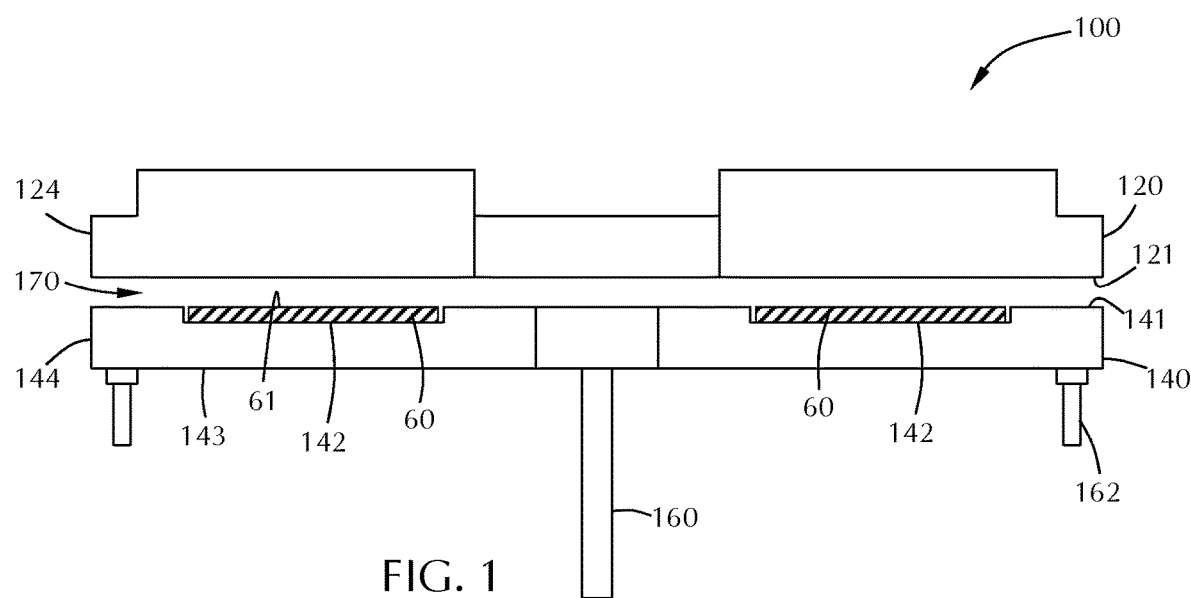
FIG. 1 shows a cross-sectional view of a batch processing chamber in accordance with one or more embodiment of the disclosure.

Some embodiments of the disclosure are directed to film deposition processes using a batch processing chamber, also referred to as a spatial processing chamber. FIG. 1 shows a cross-section of a processing chamber 100 including a gas distribution assembly 120, also referred to as injectors or an injector assembly, and a susceptor assembly 140. The gas distribution assembly 120 is any type of gas delivery device used in a processing chamber. The gas distribution assembly 120 includes a front surface 121 which faces the susceptor assembly 140. The front surface 121 can have any number or variety of openings to deliver a flow of gases toward the susceptor assembly 140. The gas distribution assembly 120 also includes an outer peripheral edge 124 which in the embodiments shown, is substantially round.

The specific type of gas distribution assembly 120 used can vary depending on the particular process being used. Embodiments of the disclosure can be used with any type of processing system where the gap between the susceptor and the gas distribution assembly is controlled. In a binary reaction, the plurality of gas channels can include at least one first reactive gas A channel, at least one second reactive gas B channel, at least one purge gas P channel and/or at least one vacuum V channel. The gases flowing from the first reactive gas A channel(s), the second reactive gas B channel(s) and the purge gas P channel(s) are directed toward the top surface of the wafer. Some of the gas flow moves horizontally across the surface of the wafer and out of the processing region through the purge gas P channel(s).

Figure 2:
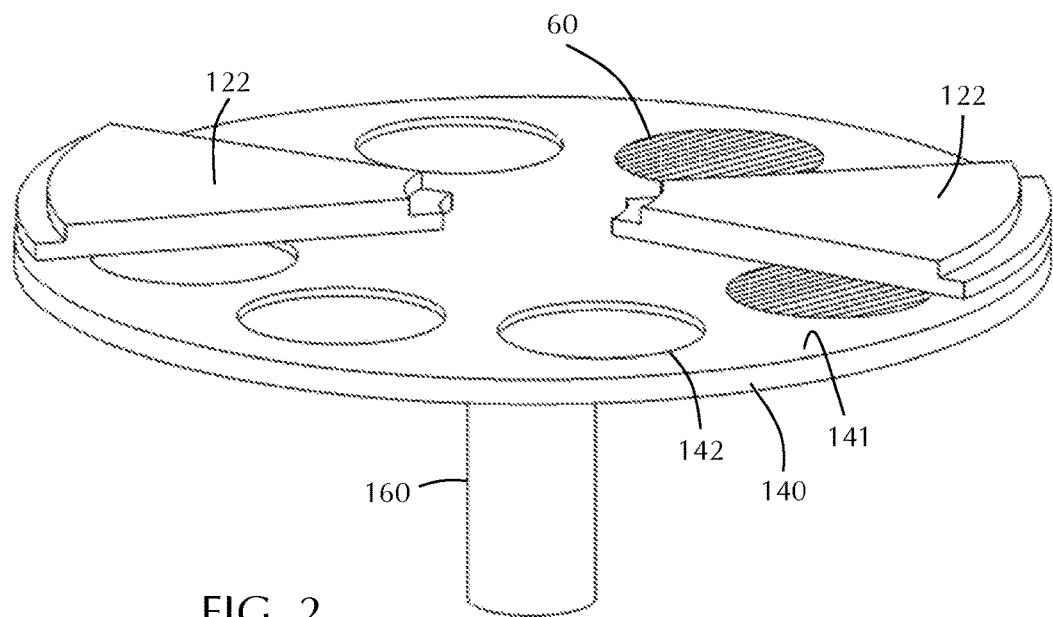
FIG. 2 shows a partial perspective view of a batch processing chamber in accordance with one or more embodiment of the disclosure.

In some embodiments, the gas distribution assembly 120 is a rigid stationary body made of a single injector unit. In one or more embodiments, the gas distribution assembly 120 is made up of a plurality of individual sectors (e.g., injector units 122), as shown in FIG. 2. Either a single piece body or a multi-sector body can be used with the various embodiments of the disclosure described.

A susceptor assembly 140 is positioned beneath the gas distribution assembly 120. The susceptor assembly 140 includes a top surface 141 and at least one recess 142 in the top surface 141. The susceptor assembly 140 also has a bottom surface 143 and an edge 144. The recess 142 can be any suitable shape and size depending on the shape and size of the substrates 60 being processed. In the embodiment shown in FIG. 1, the recess 142 has a flat bottom to support the bottom of the wafer; however, the bottom of the recess can vary. In some embodiments, the recess has step regions around the outer peripheral edge of the recess which are sized to support the outer peripheral edge of the wafer. The amount of the outer peripheral edge of the wafer that is supported by the steps can vary depending on, for example, the thickness of the wafer and the presence of features already present on the back side of the wafer.

In some embodiments, as shown in FIG. 1, the recess 142 in the top surface 141 of the susceptor assembly 140 is sized so that a substrate 60 supported in the recess 142 has a top surface 61 substantially coplanar with the top surface 141 of the susceptor 140. As used in this specification and the appended claims, the term "substantially coplanar" means that the top surface of the wafer and the top surface of the susceptor assembly are coplanar within ±0.2 mm. In some embodiments, the top surfaces are coplanar within ±0.15 mm, ±0.10 mm or ±0.05 mm.

The susceptor assembly 140 of FIG. 1 includes a support post 160 which is capable of lifting, lowering and rotating the susceptor assembly 140. The susceptor assembly may include a heater, or gas lines, or electrical components within the center of the support post 160. The support post 160 may be the primary means of increasing or decreasing the gap between the susceptor assembly 140 and the gas distribution assembly 120, moving the susceptor assembly 140 into proper position. The susceptor assembly 140 may also include fine tuning actuators 162 which can make micro-adjustments to susceptor assembly 140 to create a predetermined gap 170 between the susceptor assembly 140 and the gas distribution assembly 120.

In some embodiments, the gap 170 distance is in the range of about 0.1 mm to about 5.0 mm, or in the range of about 0.1 mm to about 3.0 mm, or in the range of about 0.1 mm to about 2.0 mm, or in the range of about 0.2 mm to about 1.8 mm, or in the range of about 0.3 mm to about 1.7 mm, or in the range of about 0.4 mm to about 1.6 mm, or in the range of about 0.5 mm to about 1.5 mm, or in the range of about 0.6 mm to about 1.4 mm, or in the range of about 0.7 mm to about 1.3 mm, or in the range of about 0.8 mm to about 1.2 mm, or in the range of about 0.9 mm to about 1.1 mm, or about 1 mm.

The processing chamber 100 shown in the Figures is a carousel-type chamber in which the susceptor assembly 140 can hold a plurality of substrates 60. As shown in FIG. 2, the gas distribution assembly 120 may include a plurality of separate injector units 122, each injector unit 122 being capable of depositing a film on the wafer, as the wafer is moved beneath the injector unit. Two pie-shaped injector units 122 are shown positioned on approximately opposite sides of and above the susceptor assembly 140. This number of injector units 122 is shown for illustrative purposes only. It will be understood that more or less injector units 122 can be included. In some embodiments, there are a sufficient number of pie-shaped injector units 122 to form a shape conforming to the shape of the susceptor assembly 140. In some embodiments, each of the individual pie-shaped injector units 122 may be independently moved, removed and/or replaced without affecting any of the other injector units 122. For example, one segment may be raised to permit a robot to access the region between the susceptor assembly 140 and gas distribution assembly 120 to load/unload substrates 60.

Figure 3:
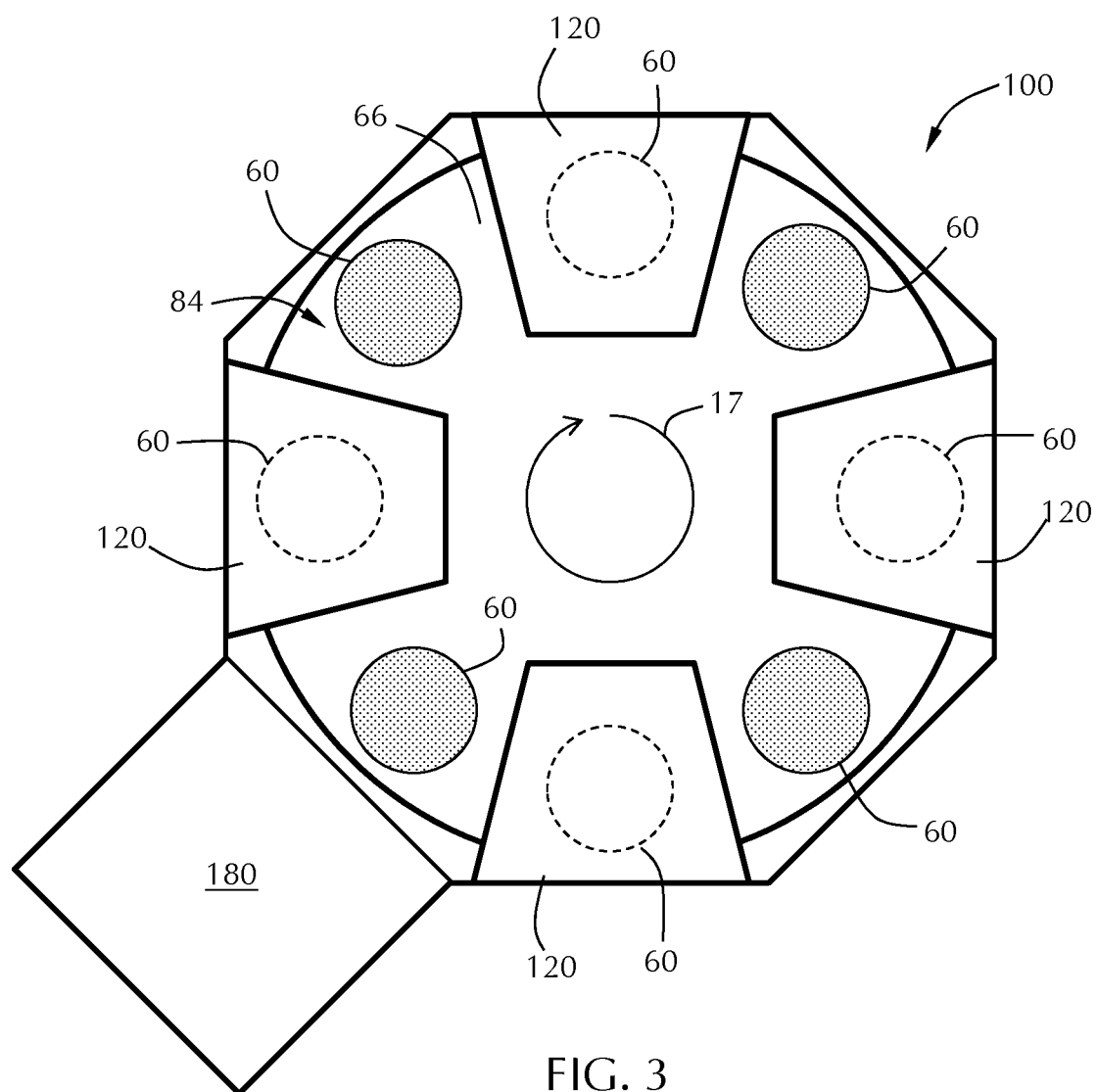
FIG. 3 shows a schematic view of a batch processing chamber in accordance with one or more embodiment of the disclosure.

Processing chambers having multiple gas injectors can be used to process multiple wafers simultaneously so that the wafers experience the same process flow. For example, as shown in FIG. 3, the processing chamber 100 has four gas injector assemblies and four substrates 60. At the outset of processing, the substrates 60 can be positioned between the gas distribution assemblies 120. Rotating 17 the susceptor assembly 140 by 45° will result in each substrate 60 which is between gas distribution assemblies 120 to be moved to an gas distribution assembly 120 for film deposition, as illustrated by the dotted circle under the gas distribution assemblies 120. An additional 45° rotation would move the substrates 60 away from the gas distribution assemblies 120. The number of substrates 60 and gas distribution assemblies 120 can be the same or different. In some embodiments, there are the same numbers of wafers being processed as there are gas distribution assemblies. In one or more embodiments, the number of wafers being processed are fraction of or an integer multiple of the number of gas distribution assemblies. For example, if there are four gas distribution assemblies, there are 4× wafers being processed, where x is an integer value greater than or equal to one. In an exemplary embodiment, the gas distribution assembly 120 includes eight processing regions separated by gas curtains and the susceptor assembly 140 can hold six wafers.

The processing chamber 100 shown in FIG. 3 is merely representative of one possible configuration and should not be taken as limiting the scope of the disclosure. Here, the processing chamber 100 includes a plurality of gas distribution assemblies 120. In the embodiment shown, there are four gas distribution assemblies (also called gas distribution assemblies 120) evenly spaced about the processing chamber 100. The processing chamber 100 shown is octagonal; however, those skilled in the art will understand that this is one possible shape and should not be taken as limiting the scope of the disclosure. The gas distribution assemblies 120 shown are trapezoidal, but can be a single circular component or made up of a plurality of pie-shaped segments, like that shown in FIG. 2.

The embodiment shown in FIG. 3 includes a load lock chamber 180, or an auxiliary chamber like a buffer station. This chamber 180 is connected to a side of the processing chamber 100 to allow, for example the substrates (also referred to as substrates 60) to be loaded/unloaded from the processing chamber 100. A wafer robot may be positioned in the chamber 180 to move the substrate onto the susceptor.

Rotation of the carousel (e.g., the susceptor assembly 140) can be continuous or intermittent (discontinuous). In continuous processing, the wafers are constantly rotating so that they are exposed to each of the injectors in turn. In discontinuous processing, the wafers can be moved to the injector region and stopped, and then to the region 84 between the injectors and stopped. For example, the carousel can rotate so that the wafers move from an inter-injector region across the injector (or stop adjacent the injector) and on to the next inter-injector region where the carousel can pause again. Pausing between the injectors may provide time for additional processing between each layer deposition (e.g., exposure to plasma).

Figure 4:
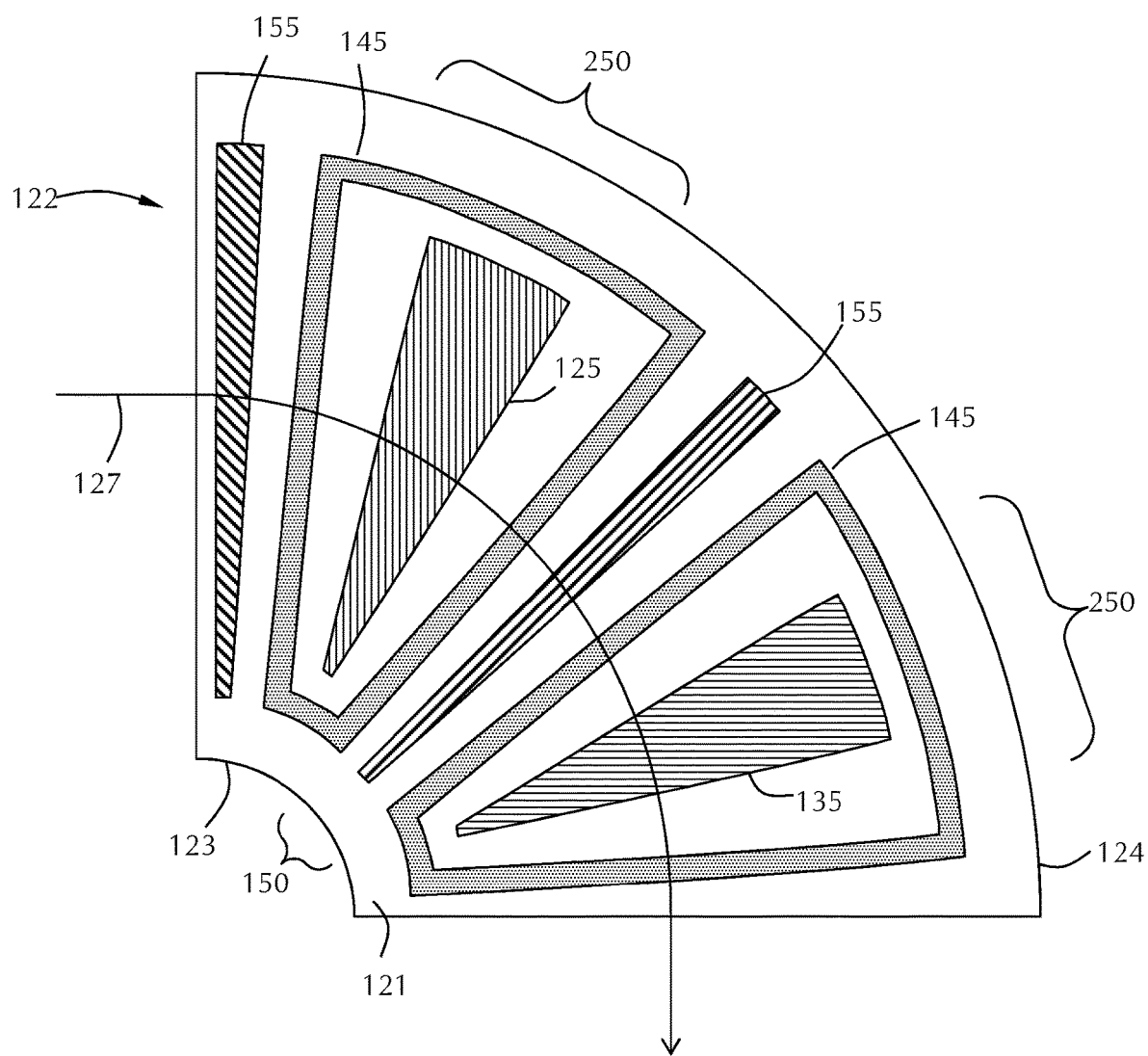
FIG. 4 shows a schematic view of a portion of a wedge shaped gas distribution assembly for use in a batch processing chamber in accordance with one or more embodiment of the disclosure.
Figure 5:
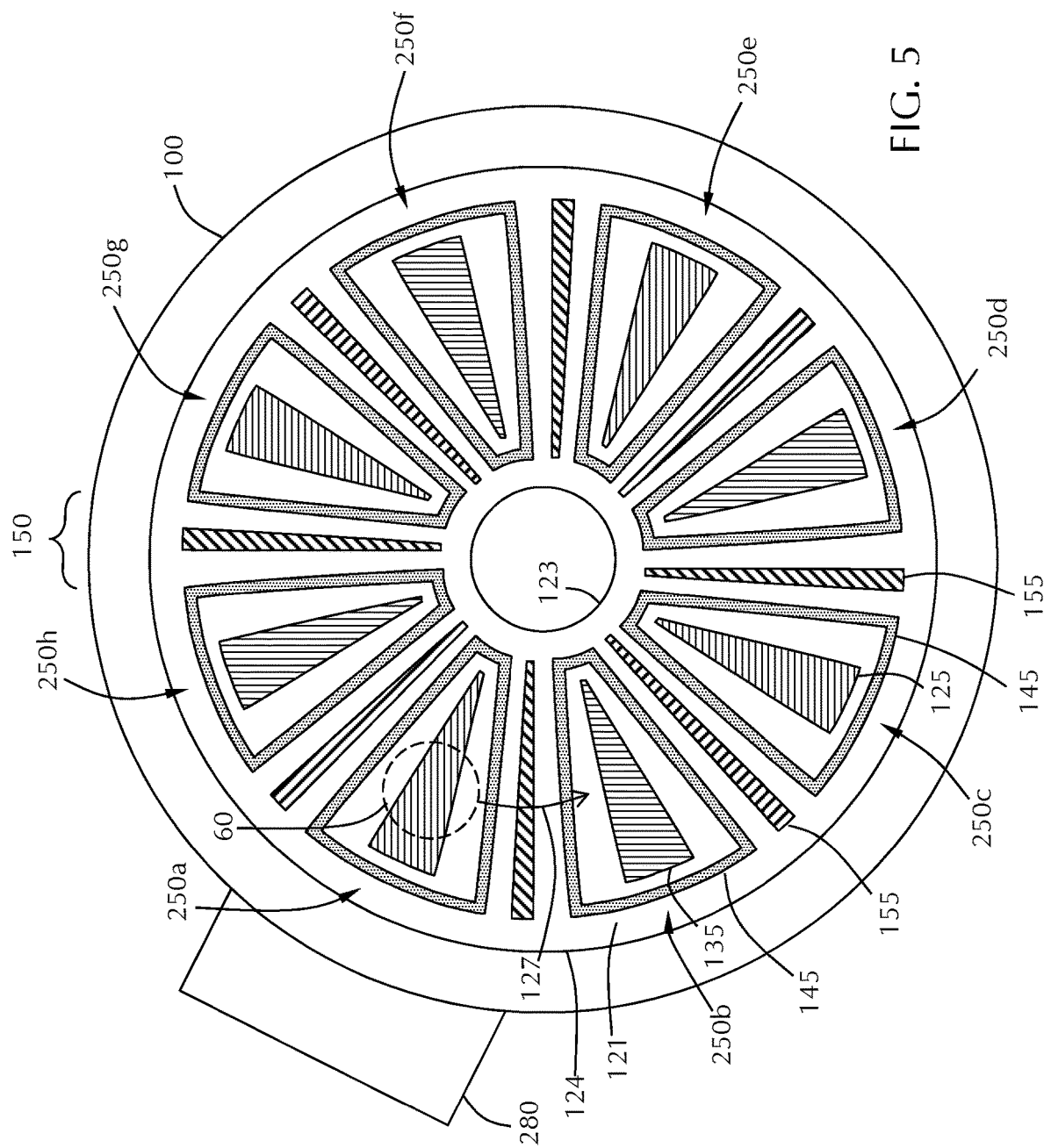
FIG. 5 shows a schematic view of a batch processing chamber in accordance with one or more embodiments of the disclosure.

FIG. 4 shows a sector or portion of a gas distribution assembly 220, which may be referred to as an injector unit 122. The injector units 122 can be used individually or in combination with other injector units. For example, as shown in FIG. 5, four of the injector units 122 of FIG. 4 are combined to form a single gas distribution assembly 220. (The lines separating the four injector units are not shown for clarity.) While the injector unit 122 of FIG. 4 has both a first reactive gas port 125 and a second gas port 135 in addition to purge gas ports 155 and vacuum ports 145, an injector unit 122 does not need all of these components.

Referring to both FIGS. 4 and 5, a gas distribution assembly 220 in accordance with one or more embodiment may comprise a plurality of sectors (or injector units 122) with each sector being identical or different. The gas distribution assembly 220 is positioned within the processing chamber and comprises a plurality of elongate gas ports 125, 135, 155 and elongate vacuum ports 145 in a front surface 121 of the gas distribution assembly 220. The plurality of elongate gas ports 125, 135, 155 and elongate vacuum ports 145 extend from an area adjacent the inner peripheral edge 123 toward an area adjacent the outer peripheral edge 124 of the gas distribution assembly 220. The plurality of gas ports shown include a first reactive gas port 125, a second gas port 135, a vacuum port 145 which surrounds each of the first reactive gas ports and the second reactive gas ports and a purge gas port 155.

With reference to the embodiments shown in FIG. 4 or 5, when stating that the ports extend from at least about an inner peripheral region to at least about an outer peripheral region, however, the ports can extend more than just radially from inner to outer regions. The ports can extend tangentially as vacuum port 145 surrounds reactive gas port 125 and reactive gas port 135. In the embodiment shown in FIGS. 4 and 5, the wedge shaped reactive gas ports 125, 135 are surrounded on all edges, including adjacent the inner peripheral region and outer peripheral region, by a vacuum port 145.

Referring to FIG. 4, as a substrate moves along path 127, each portion of the substrate surface is exposed to the various reactive gases. To follow the path 127, the substrate will be exposed to, or "see", a purge gas port 155, a vacuum port 145, a first reactive gas port 125, a vacuum port 145, a purge gas port 155, a vacuum port 145, a second gas port 135 and a vacuum port 145. Thus, at the end of the path 127 shown in FIG. 4, the substrate has been exposed to the first gas port 125 and the second gas port 135 to form a layer. The injector unit 122 shown makes a quarter circle but could be larger or smaller. The gas distribution assembly 220 shown in FIG. 5 can be considered a combination of four of the injector units 122 of FIG. 4 connected in series.

The injector unit 122 of FIG. 4 shows a gas curtain 150 that separates the reactive gases. The term "gas curtain" is used to describe any combination of gas flows or vacuum that separate reactive gases from mixing. The gas curtain 150 shown in FIG. 4 comprises the portion of the vacuum port 145 next to the first reactive gas port 125, the purge gas port 155 in the middle and a portion of the vacuum port 145 next to the second gas port 135. This combination of gas flow and vacuum can be used to prevent or minimize gas phase reactions of the first reactive gas and the second reactive gas.

Referring to FIG. 5, the combination of gas flows and vacuum from the gas distribution assembly 220 form a separation into a plurality of processing regions 250. The processing regions are roughly defined around the individual gas ports 125, 135 with the gas curtain 150 between 250. The embodiment shown in FIG. 5 makes up eight separate processing regions 250 with eight separate gas curtains 150 between. A processing chamber can have at least two processing region. In some embodiments, there are at least three, four, five, six, seven, eight, nine, 10, 11 or 12 processing regions.

During processing a substrate may be exposed to more than one processing region 250 at any given time. However, the portions that are exposed to the different processing regions will have a gas curtain separating the two. For example, if the leading edge of a substrate enters a processing region including the second gas port 135, a middle portion of the substrate will be under a gas curtain 150 and the trailing edge of the substrate will be in a processing region including the first reactive gas port 125.

A factory interface 280, which can be, for example, a load lock chamber, is shown connected to the processing chamber 100. A substrate 60 is shown superimposed over the gas distribution assembly 220 to provide a frame of reference. The substrate 60 may often sit on a susceptor assembly to be held near the front surface 121 of the gas distribution assembly 120. The substrate 60 is loaded via the factory interface 280 into the processing chamber 100 onto a substrate support or susceptor assembly (see FIG. 3). The substrate 60 can be shown positioned within a processing region because the substrate is located adjacent the first reactive gas port 125 and between two gas curtains 150*a*, 150*b*. Rotating the substrate 60 along path 127 will move the substrate counter-clockwise around the processing chamber 100. Thus, the substrate 60 will be exposed to the first processing region 250*a* through the eighth processing region 250*h*, including all processing regions between.

Embodiments of the disclosure are directed to processing methods comprising a processing chamber 100 with a plurality of processing regions 250*a*-250*h* with each processing region separated from an adjacent region by a gas curtain 150. For example, the processing chamber shown in FIG. 5. The number of gas curtains and processing regions within the processing chamber can be any suitable number depending on the arrangement of gas flows. The embodiment shown in FIG. 5 has eight gas curtains 150 and eight processing regions 250*a*-250*h*. The number of gas curtains is generally equal to or greater than the number of processing regions.

A plurality of substrates 60 are positioned on a substrate support, for example, the susceptor assembly 140 shown FIGS. 1 and 2. The plurality of substrates 60 are rotated around the processing regions for processing. Generally, the gas curtains 150 are engaged (gas flowing and vacuum on) throughout processing including periods when no reactive gas is flowing into the chamber.

With reference to FIGS. 6 to 9, embodiments of the disclosure are directed to susceptor assemblies 300. The susceptor assemblies 300 include a susceptor 310 and a support post 350. The susceptor 310 has a body 312 with a top surface 314 and a bottom surface 316. The top surface 314 has a plurality of recesses 320 therein.

The support post 350 is connected to the bottom surface 316 of the susceptor 310 to rotate the susceptor assembly 300. The support post 350 includes a support post vacuum plenum 352 in fluid communication with a susceptor vacuum plenum 322 in the body 312 of the susceptor 310.

Figure 7:
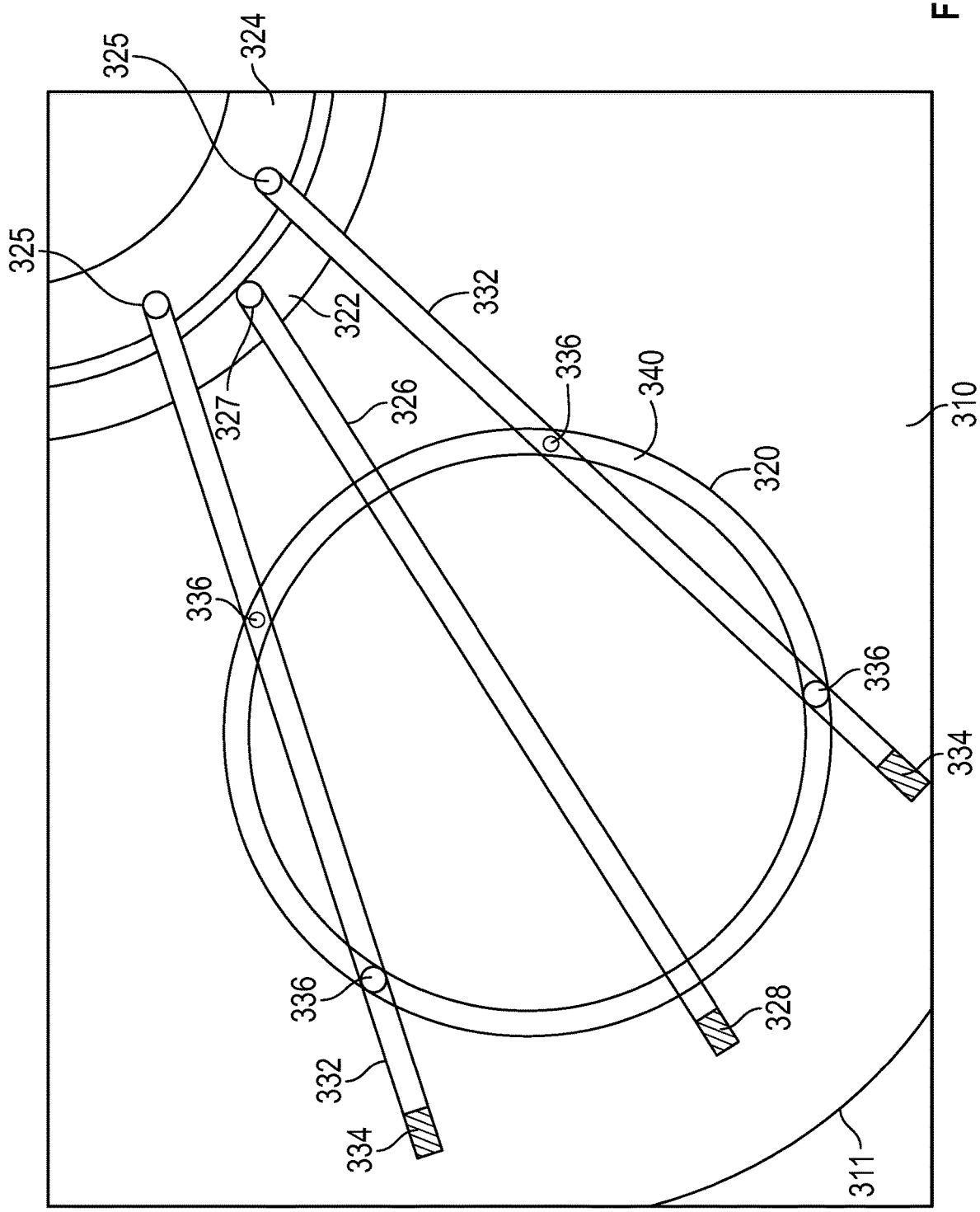
FIG. 7 shows a transparent view of a susceptor in accordance with one or more embodiment of the disclosure.

As shown in FIG. 7, some embodiments further comprise a plurality of radial vacuum feed channels 326 that extend from the susceptor vacuum plenum 322 at connection 327. The radial vacuum feed channels 326 are in fluid communication with the susceptor vacuum plenum 322. The radial vacuum feed channels 326 extend toward the outer peripheral edge 311 of the susceptor 310 and may be closed with plug 328 to form a sealed channel.

Figure 9:
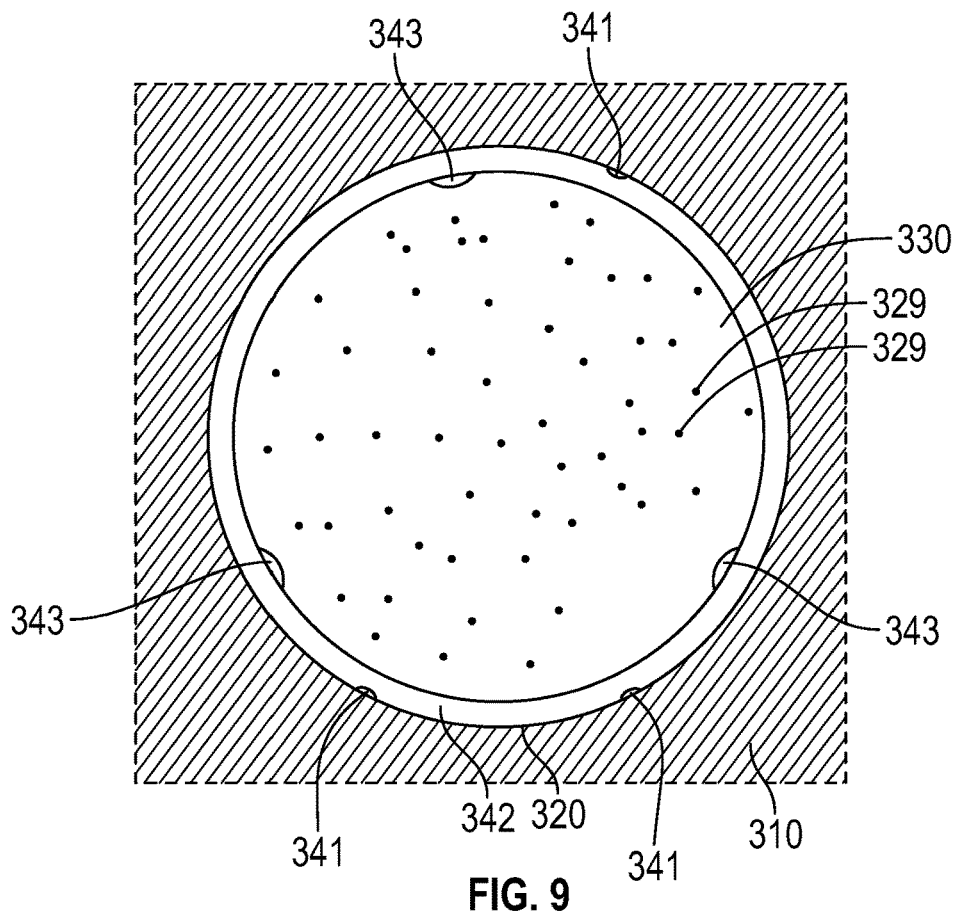
FIG. 9 shows a partial top view of a susceptor in accordance with one or more embodiment of the disclosure.

The radial vacuum feed channels 326 provide vacuum to the recesses 320. The vacuum can connect to the recess 320 through a plurality of apertures 329 in the top surface 330 of the recess 320, as shown in FIG. 9. There can be any suitable number of radial vacuum feed channels 326 per recess 320.

In some embodiments, as shown in FIG. 7, there is one radial vacuum feed channel 326 per recess 320. The radial vacuum feed channel 326 may extend from the susceptor vacuum plenum 322 to a point near the outer peripheral edge 311 of the susceptor 310 through a point near the center of the recess 320.

The support post 350 also includes a purge gas line 354 extending through the support post 350 to a purge gas plenum 324 in the body 312 of the susceptor 310. The purge gas line 354 of some embodiments extends through the support post 350, splits into a plurality of upper purge gas lines 356 at a junction 355. In some embodiments, each of the plurality of upper purge gas lines 356 has substantially equal conductance. As used in this regard, the term "substantially equal conductance" means that the gas conductance through the lines is within ±10% of the average conductance for each line.

Figure 6:
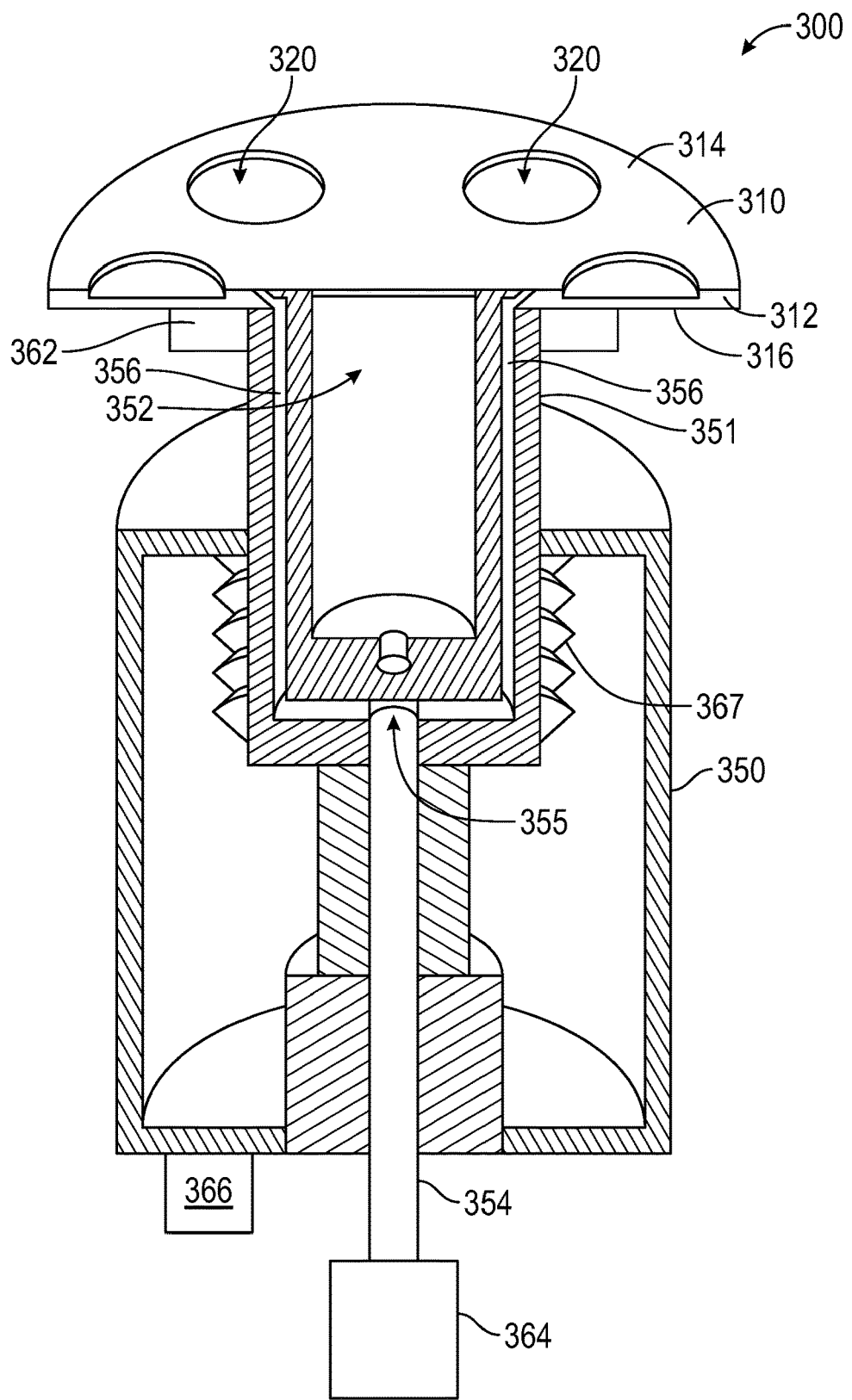
FIG. 6 shows a partial cross-sectional view of a susceptor assembly in accordance with one or more embodiment of the disclosure.

In some embodiments, as shown in FIG. 6, the support post vacuum plenum 352 is positioned in a central portion of a top of the support post 350. In the embodiment shown, each of the plurality of upper purge gas lines 356 extend from a junction 355 below the support post vacuum plenum 352 to the body 312 of the susceptor 310 around the support post vacuum plenum 352.

Referring again to FIG. 7, some embodiments further comprise a plurality of radial purge gas feed channels 332 in fluid communication with the purge gas plenum 324 at junction 325. There can be any suitable number of radial purge gas feed channels 332 in fluid communication with each of the recesses 320. In some embodiments, there are two radial purge gas feed channels 332 in fluid communication with each recess 320. The two radial purge gas feed channels 332 extend from the purge gas plenum 324 toward the outer peripheral edge 311 of the susceptor 310 and connect to the recess 320 off-center. The outer end of the radial purge gas feed channels 332 can be plugged with plug 334.

In the embodiment shown, each of the radial purge gas feed channels 332 connects to an annular plenum 340 of the recess 320 with two holes 336. In some embodiments, each of the two holes 336 has a different size so that each hole 336 has substantially equal conductance of purge gas flowing into the annular plenum 340 of the recess 320. As used in this regard, the term "substantially equal conductance" means that the gas conductance through the holes 336 is within ±10% of the average conductance for each hole 336.

Figure 8:
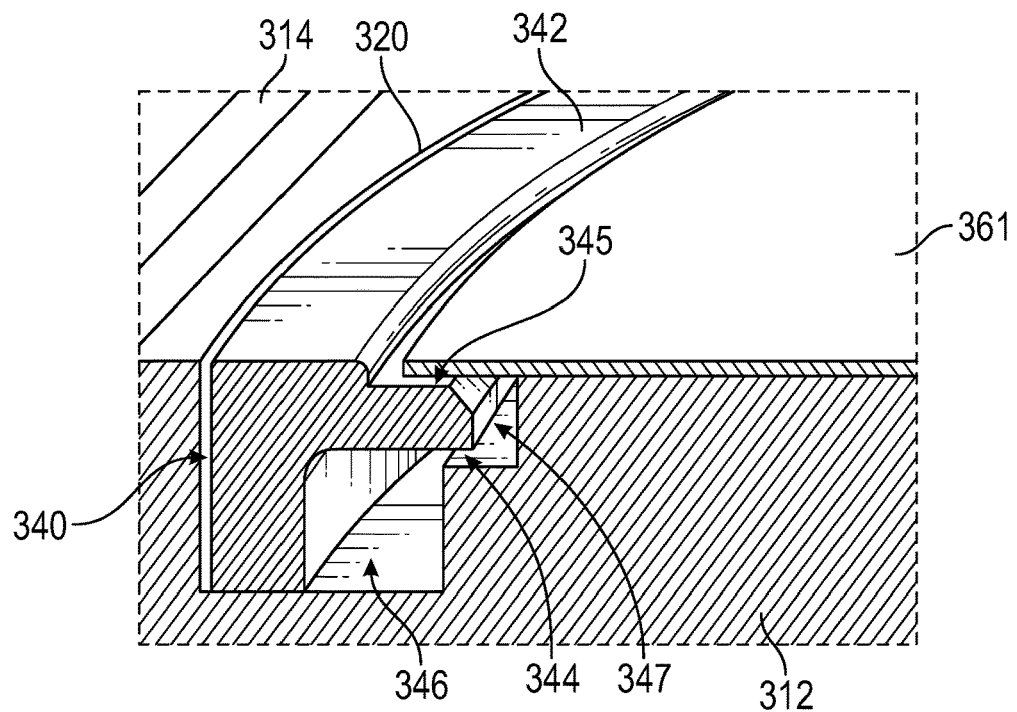
FIG. 8 shows a partial side view of a purge ring in accordance with one or more embodiment of the disclosure.

As shown in FIG. 8, some embodiments further comprise a purge gas ring 342 in each recess 320. The purge gas ring 342 is positioned within the annular plenum 340 of the recess 320. The purge gas ring 342 of some embodiments comprises a first compression gap 344 forming a first ring plenum 346 to increase pressure uniformity in the first ring plenum 346. The size of the first compression gap 344 can be any suitable size. In some embodiments, the first compression gap 344 is in the range of about 200 µm to about 800 µm or about 400 µm.

In some embodiments, the purge gas ring 342 further comprises a second compression gap 345 forming a second ring plenum 347 to define an annular velocity of gas exiting the second ring plenum 347 to prevent or minimize backside deposition. The second compression gap can be any suitable size. In some embodiments, the second compression gap 345 is in the range of about 100 µm to about 500 µm, or about 200 µm. In some embodiments, the size of the second compression gap 345 is smaller than the size of the first compression gap 344. Those skilled in the art will understand that the first compression gap 344 and the second compression gap 345 are formed between the purge gas ring 342 and the susceptor body 312.

The purge gas ring 342 can be held in the annular plenum 340 of the recess 320 by any suitable technique and hardware. In some embodiments, the purge gas ring 342 is held in place by gravity alone or is held in place by one or more screws (not shown).

Referring back to FIG. 6, some embodiments include a torque plate 362 connected to a top of the lift 351. The torque plate 362 provides a strong location to connect the lift 351 portion of the support post 350 to the susceptor 310. The torque plate can be connected to the susceptor 310 with a plurality of bolts (not shown) or through other mechanical fasteners.

The embodiment shown includes a purge gas union 364 connected to purge gas line 354. The purge gas union 364 provides a place to connect the purge gas source (not shown) to the purge gas line 354 so that a suitable flow of purge gas can be maintained during use.

The support post 350 may also include a z-axis motor 366 to move the entire support post 350 up and down. In some embodiments, the z-axis motor 366 is configured to move the lift 351 portion of the support post 350 up and down within the support post 350. The bellows 367 can expand and contract to maintain a seal within the support post.

Referring to FIG. 9, some embodiments of the purge gas ring 342 include a plurality of locating pins 341. The locating pins 341 are stationary and hold the purge gas ring 342 in the center of the annular plenum 340 of the recess. There can be any suitable number of locating pins 341. In some embodiments, there is three or more locating pins 341.

Some embodiments also include locating handles 343 located around the radius of the purge gas ring 342. The locating handles 343 center the wafer 361 within the purge gas ring 342 so that the flow of backside purge gas is about the same around the outer edge of the wafer 361. There can be any suitable number of locating handles 343. In some embodiments, there are 3, 4, 5, 6, 7, 8, 9, 10 or more locating handles 343.

According to one or more embodiments, the substrate is subjected to processing prior to and/or after forming the layer. This processing can be performed in the same chamber or in one or more separate processing chambers. In some embodiments, the substrate is moved from the first chamber to a separate, second chamber for further processing. The substrate can be moved directly from the first chamber to the separate processing chamber, or it can be moved from the first chamber to one or more transfer chambers, and then moved to the separate processing chamber. Accordingly, the processing apparatus may comprise multiple chambers in communication with a transfer station. An apparatus of this sort may be referred to as a "cluster tool" or "clustered system," and the like.

Generally, a cluster tool is a modular system comprising multiple chambers which perform various functions including substrate center-finding and orientation, degassing, annealing, deposition and/or etching. According to one or more embodiments, a cluster tool includes at least a first chamber and a central transfer chamber. The central transfer chamber may house a robot that can shuttle substrates between and among processing chambers and load lock chambers. The transfer chamber is typically maintained at a vacuum condition and provides an intermediate stage for shuttling substrates from one chamber to another and/or to a load lock chamber positioned at a front end of the cluster tool. Two well-known cluster tools which may be adapted for the present disclosure are the Centura® and the Endura®, both available from Applied Materials, Inc., of Santa Clara, Calif. However, the exact arrangement and combination of chambers may be altered for purposes of performing specific steps of a process as described herein. Other processing chambers which may be used include, but are not limited to, cyclical layer deposition (CLD), atomic layer deposition (ALD), chemical vapor deposition (CVD), physical vapor deposition (PVD), etch, pre-clean, chemical clean, thermal treatment such as RTP, plasma nitridation, degas, orientation, hydroxylation and other substrate processes. By carrying out processes in a chamber on a cluster tool, surface contamination of the substrate with atmospheric impurities can be avoided without oxidation prior to depositing a subsequent film.

According to one or more embodiments, the substrate is continuously under vacuum or "load lock" conditions, and is not exposed to ambient air when being moved from one chamber to the next. The transfer chambers are thus under vacuum and are "pumped down" under vacuum pressure. Inert gases may be present in the processing chambers or the transfer chambers. In some embodiments, an inert gas is used as a purge gas to remove some or all of the reactants. According to one or more embodiments, a purge gas is injected at the exit of the deposition chamber to prevent reactants from moving from the deposition chamber to the transfer chamber and/or additional processing chamber. Thus, the flow of inert gas forms a curtain at the exit of the chamber.

The substrate can be processed in single substrate deposition chambers, where a single substrate is loaded, processed and unloaded before another substrate is processed. The substrate can also be processed in a continuous manner, similar to a conveyer system, in which multiple substrate are individually loaded into a first part of the chamber, move through the chamber and are unloaded from a second part of the chamber. The shape of the chamber and associated conveyer system can form a straight path or curved path. Additionally, the processing chamber may be a carousel in which multiple substrates are moved about a central axis and are exposed to deposition, etch, annealing, cleaning, etc. processes throughout the carousel path.

During processing, the substrate can be heated or cooled. Such heating or cooling can be accomplished by any suitable means including, but not limited to, changing the temperature of the substrate support and flowing heated or cooled gases to the substrate surface. In some embodiments, the substrate support includes a heater/cooler which can be controlled to change the substrate temperature conductively. In one or more embodiments, the gases (either reactive gases or inert gases) being employed are heated or cooled to locally change the substrate temperature. In some embodiments, a heater/cooler is positioned within the chamber adjacent the substrate surface to convectively change the substrate temperature.

The substrate can also be stationary or rotated during processing. A rotating substrate can be rotated continuously or in discrete steps. For example, a substrate may be rotated throughout the entire process, or the substrate can be rotated by a small amount between exposures to different reactive or purge gases. Rotating the substrate during processing (either continuously or in steps) may help produce a more uniform deposition or etch by minimizing the effect of, for example, local variability in gas flow geometries.

Reference throughout this specification to "one embodiment," "certain embodiments," "one or more embodiments" or "an embodiment" means that a particular feature, structure, material, or characteristic described in connection with the embodiment is included in at least one embodiment of the disclosure. Thus, the appearances of the phrases such as "in one or more embodiments," "in certain embodiments," "in one embodiment" or "in an embodiment" in various places throughout this specification are not necessarily referring to the same embodiment of the disclosure. Furthermore, the particular features, structures, materials, or characteristics may be combined in any suitable manner in one or more embodiments.

Although the disclosure herein has been described with reference to particular embodiments, it is to be understood that these embodiments are merely illustrative of the principles and applications of the present disclosure. It will be apparent to those skilled in the art that various modifications and variations can be made to the method and apparatus of the present disclosure without departing from the spirit and scope of the disclosure. Thus, it is intended that the present disclosure include modifications and variations that are within the scope of the appended claims and their equivalents.

What is claimed is:

1. A susceptor assembly comprising:
a susceptor having a body with a top surface and bottom surface, the top surface having a plurality of recesses therein; and
a support post connected to the bottom surface of the susceptor to rotate the susceptor assembly, the support post including
a support post vacuum plenum in fluid communication with a susceptor vacuum plenum in the body of the susceptor, and
a purge gas line extending through the support post to a purge gas plenum in the body of the susceptor.

2. The susceptor assembly of claim 1, wherein the purge gas line extending through the support post splits into a plurality of upper purge gas lines at a junction.

3. The susceptor assembly of claim 2, wherein each of the plurality of upper purge gas lines has substantially equal conductance.

4. The susceptor assembly of claim 3, wherein the support post vacuum plenum is positioned in a central portion of a top of the support post.

5. The susceptor assembly of claim 4, wherein each of the plurality of upper purge gas lines extend from the junction below the support post vacuum plenum to the body of the susceptor around the support post vacuum plenum.

6. The susceptor assembly of claim 1, further comprising a plurality of radial purge gas feed channels in the body of the susceptor, the radial purge gas feed channels in fluid communication with the purge gas plenum.

7. The susceptor assembly of claim 6, wherein there are at least two radial purge gas feed channels in fluid communication with each of the recesses.

8. The susceptor assembly of claim 7, wherein the at least two radial purge gas feed channels connect to the recess off-center.

9. The susceptor assembly of claim 8, wherein each of the radial purge gas feed channels connects to an annular plenum of the recess with two holes.

10. The susceptor assembly of claim 9, wherein each of the two holes have different sizes to have an equal conductance of purge gas flowing into the annular plenum of the recess.

11. The susceptor assembly of claim 1, further comprising a plurality of radial vacuum feed channels, the radial vacuum feed channels in fluid communication with the susceptor vacuum plenum.

12. The susceptor assembly of claim 11, wherein there is one of said plurality of radial vacuum feed channels per each of said plurality of recesses.

13. The susceptor assembly of claim 12, wherein the plurality of radial vacuum feed channels is in fluid communication with a plurality of apertures in the recess.

14. The susceptor assembly of claim 1, further comprising a purge ring in each of said plurality of recesses.

15. The susceptor assembly of claim 14, wherein the purge ring comprises a first compression gap forming a first ring plenum to increase pressure uniformity in the first ring plenum.

16. The susceptor assembly of claim 15, wherein the first compression gap is about 400 μm.

17. The susceptor assembly of claim 16, wherein the purge ring further comprises a second compression gap forming a second ring plenum to define an annular velocity of gas exiting the second ring plenum.

18. The susceptor assembly of claim 17, wherein the second compression gap is about 200 μm.

19. A susceptor assembly comprising:
a susceptor having a body with a top surface and bottom surface, the top surface having a plurality of recesses therein, each of the recesses having a purge ring within the recess forming an annular plenum;
a support post connected to the bottom surface of the susceptor to rotate the susceptor assembly, the support post including
a support post vacuum plenum in fluid communication with a susceptor vacuum plenum in the body of the susceptor, and
a purge gas line extending through the support post to a purge gas plenum in the body of the susceptor;
a plurality of radial purge gas feed channels within the body, wherein two radial purge gas feed channels are in fluid communication with the purge gas plenum and the annular plenum of each of the recesses; and
a plurality of radial vacuum feed channels, wherein one of the plurality of radial vacuum feed channels is in fluid communication with the susceptor vacuum plenum and each of the plurality of recesses.

20. A susceptor assembly comprising:
a susceptor having a body with a top surface and bottom surface, the top surface having a plurality of recesses therein, each of the recesses having a purge ring within the recess forming an annular plenum, the purge ring comprising a first compression gap forming a first ring plenum to increase pressure uniformity in the first ring plenum and a second compression gap forming a second ring plenum to define an annular velocity of gas exiting the second ring plenum;
a support post connected to the bottom surface of the susceptor to rotate the susceptor assembly, the support post including
a support post vacuum plenum in a central portion of a top of the support post, the support post vacuum plenum in fluid communication with a susceptor vacuum plenum in the body of the susceptor, and
a purge gas line extending through the support post, splitting at a junction below the support post vacuum plenum into two upper purge gas lines, the upper purge gas lines having substantially the same conductance and in fluid communication with a purge gas plenum in the body of the susceptor;
a plurality of radial purge gas feed channels within the body, wherein two radial purge gas feed channels are in fluid communication with the purge gas plenum and the annular plenum of each of the recesses, each of the radial purge gas feed channels having two holes of different sizes with substantially the same conductance; and a plurality of radial vacuum feed channels, wherein one of the plurality of radial vacuum feed channel is in fluid communication with the susceptor vacuum plenum and each of the plurality of recesses, each of the radial vacuum feed channels in fluid communication with a plurality of apertures in the recess.

* * * * *